United States Patent [19]

Ma et al.

[11] Patent Number: 5,517,043
[45] Date of Patent: May 14, 1996

[54] SPLIT PIXEL INTERLINE TRANSFER IMAGING DEVICE

[75] Inventors: Fred S. F. Ma, Scarborough; Stacy R. Kamasz, Waterloo, both of Canada; Michael G. Farrier, Redwood Shores, Calif.; Mark P. Bendett, Ann Arbor; Carl Leonard, Dexter, both of Mich.

[73] Assignees: Dalsa, Inc., Ontario, Canada; IMRA America, Inc., Ann Arbor, Mich.

[21] Appl. No.: 328,922

[22] Filed: Oct. 25, 1994

[51] Int. Cl.[6] .................. H01L 27/148; H01L 29/768
[52] U.S. Cl. .............. 257/229; 257/230; 257/231; 257/232; 257/233
[58] Field of Search ............... 257/232, 233, 257/231, 223, 230, 229

[56] References Cited

U.S. PATENT DOCUMENTS

| | | | |
|---|---|---|---|
| 4,336,556 | 6/1982 | Sekine et al. | 257/232 X |
| 4,476,568 | 10/1984 | Prince | 377/60 |
| 4,593,303 | 6/1986 | Dyck et al. | 357/24 |
| 5,243,180 | 9/1993 | Nam | 257/233 X |
| 5,379,067 | 1/1995 | Miura | 257/233 X |
| 5,396,091 | 3/1995 | Kobayashi et al. | 257/233 X |

FOREIGN PATENT DOCUMENTS 6461176  3/1989  Japan .

OTHER PUBLICATIONS

"Charge Transfer Devices", Carlo H. Sequin et al., Academic Press, Inc., 1975, Title page and Table of Contents only.

"Charge–couples Devices and Systems", M. J. Howes et al., John Wiley & Sons, 1980, Title page and Table of Contents only.

*Primary Examiner*—William Mintel
*Attorney, Agent, or Firm*—Burns, Doane, Swecker & Mathis

[57] ABSTRACT

The present invention is directed to providing a charge-coupled device which can provide accurate signal detection while providing high speed electronic exposure control or shuttering. Exemplary embodiments can maintain charge transfer efficiency at a relatively high level even if a pixel array of the charge-coupled device is clocked rapidly (i.e., exposure control or shuttering speed is increased) for a given pixel pitch.

17 Claims, 3 Drawing Sheets

5,517,043

SPLIT PIXEL INTERLINE TRANSFER IMAGING DEVICE

BACKGROUND OF THE INVENTION

1. Field of the Invention

The present invention relates generally to methods and apparatus for detecting light energy using light sensitive devices such as charge-coupled devices (CCDs), and in particular to methods and apparatus for accurately detecting light signals using a charge-coupled device imaging array formed with interline transfer type pixels.

2. State of the Art

Charge-coupled device imaging arrays which use interline transfer pixels are known. These imaging arrays typically integrate (i.e., collect or accumulate) photocharge using photoelements such as polysilicon photogates, photodiodes or pinned photodiodes. A vertical shift register (e.g., charge-coupled device) is typically used to transfer the accumulated photocharge to a read-out device. Charge-coupled device imaging arrays are useful for detection applications such as imaging and laser radar.

FIG. 1 illustrates a typical interline transfer pixel 100 for use in a conventional charge-coupled device. A photocharge accumulation area 102 is illustrated in FIG. 1 as a photogate of length L. Charge accumulated in the photocharge accumulation area is transferred to a vertical shift register 104 which includes polysilicon gates 106. For purposes of illustration, the charge-coupled device vertical shift register 104 is four phase, although any number of such phases can be used.

In a conventional array of interline transfer pixels as shown in FIG. 1, pixels are separated by an exposure control/anti-blooming drain 108 which runs vertically through a column of pixels. An exposure control/anti-blooming structure, such as a polysilicon metal-oxide semiconductor (MOS) gate and a diode can be provided for each interline transfer pixel. In the exemplary FIG. 1 embodiment, a buried drain with self-aligned p-type and n-type implants can be used for exposure control as the anti-blooming drain 108. Thus, the exemplary FIG. 1 embodiment illustrates a lateral anti-blooming structure which includes a buried drain created by self-aligned p-type and n-type implants (i.e., a buried drain), and further including a photogate type photocharge accumulation area.

Metal buses, such as metal bus 110, run throughout a column above the vertical shift register 104. By rendering the metal buses opaque, the vertical shift register can be shielded from light to prevent additional photocharge from being accumulated therein. The metal buses are also used to bring clock signals to the gates of the vertical shift register via contacts 112. Channel stop regions, represented as channel stops 114, can be included to vertically delineate the pixels of the imaging array illustrated in FIG. 1. Thus, the exemplary FIG. 1 embodiment represents the use of an opaque layer of metal to cover the entire circuit with the exception of the light sensitive photocharge accumulation area 102 within each pixel.

FIG. 2 illustrates potentials beneath the FIG. 1 pixel during a charge transfer from the photocharge accumulation area 102 to the vertical shift register 104 via cross-sectional area A–A' in FIG. 1. A gate 116 of the vertical shift register is set to a high voltage bias relative to the voltage bias of the photogate 118 in the photocharge accumulation area 102. Photocharge accumulated in the photogate 118 therefore flows from the photogate into the gate 116 of the vertical shift register as illustrated.

A potential of a buried drain 120 corresponding to the anti-blooming drain 108 of FIG. 1 is set to the same potential as that of a channel under the photogate 118. A barrier 122 in the buried drain 120 prevents charge under the photogate 118 from flowing into the buried drain 120.

Fringe fields in a region under the photogate 118 do not significantly affect photocharge near the center and far edges of the photogate 118. Where charge packets accumulated in the photogate 118 are relatively large, self-repulsion will transfer a significant portion of the photocharge stored therein across the length L to the vertical shift register (i.e., to the gate 116). Thermal diffusion will then transfer any remaining charge in the photogate across the length L of the photogate into the gate 116 of the vertical shift register.

The length L of the photogate 118 in FIG. 2 and the photocharge accumulation area 102 in FIG. 1 (i.e., the distance from a far lateral edge of the photocharge accumulation area 102 adjacent the antiblooming drain 108, to the gate 106 of the vertical shift register 104) is relatively long to provide an adequate pixel pitch for low energy laser pulse detection. However, increased distance of the photocharge accumulation area can significantly affect performance since photocharge accumulated in the photogate 118 is transferred relatively slowly across the distance L into the gate 116, and requires that the charge-coupled device be clocked at a relatively slow rate to provide adequate charge transfer efficiency (CTE). If the pixels of the imaging array are clocked too fast, charge transfer efficiency can be substantially reduced to the point where accurate signal detection is impossible.

Thus, as the lengths of photogates are increased, transfer time can be significantly increased thereby negatively impacting charge transfer efficiency during high speed operation. In pixel arrays operated at high speeds using pixels of relatively large pitch, the photogate length will affect the minimum transfer time and/or affect the charge transfer efficiency. The transfer time can thus become an especially critical factor in high speed exposure control or shuttering. At present, conventional charge-coupled device imaging arrays constructed using interline transfer type pixels as described with respect to FIGS. 1 and 2 are inadequate in addressing the degraded performance which results from high speed operation, and thereby are substantially limited in their ability to provide high speed electronic exposure control or shuttering in applications where accurate signal detection is necessary.

SUMMARY OF THE INVENTION

Accordingly, the present invention is directed to providing a charge-coupled device which can provide accurate signal detection while providing high speed electronic exposure control or shuttering. Exemplary embodiments can maintain charge transfer efficiency at a relatively high level even if a pixel array of the charge-coupled device is clocked rapidly (i.e., exposure control or shuttering speed is increased) for a given pixel pitch (e.g., for the pixel pitch described with respect to FIG. 1).

Exemplary embodiments relate to an apparatus and method for detecting photocharge by accumulating photocharge in a first photocharge accumulation area of at least one pixel and in a second photocharge accumulation area of said at least one pixel, and by combining the photocharge accumulated in each of said first and second photocharge accumulation areas into a single photocharge packet. Exemplary embodiments include a photocharge accumulation area for a single pixel which is split into two regions, each of which can be half the area of a conventional photocharge accumulation area but of the same height as a conventional photocharge accumulation area. Each of the photocharge accumulation areas can be situated on either side of a combining means (e.g., a vertical shift register). Outer edges of the two photocharge accumulation areas can be separated from outer edges of adjacent pixels using, for example, an anti-blooming structure such as a buried drain.

Significant advantages can be achieved in accordance with exemplary embodiments of the present invention. For example, although the overall length of the photocharge accumulation area for a given pixel can be comparable to that of a conventional pixel, by separating this photocharge accumulation area into two equal halves, the thermal diffusion time constant can be reduced by a factor of four. Thus, charge transfer efficiency can be improved for a reduced transfer time such that faster electronic exposure control and shuttering speeds can be realized without degrading signal detection.

BRIEF DESCRIPTION OF THE DRAWINGS

The present invention can be further understood with reference to the following description and the appended drawings, wherein like elements are provided with the same reference numerals. In the drawings.

DETAILED DESCRIPTION OF THE PREFERRED EMBODIMENTS

Figure 3:
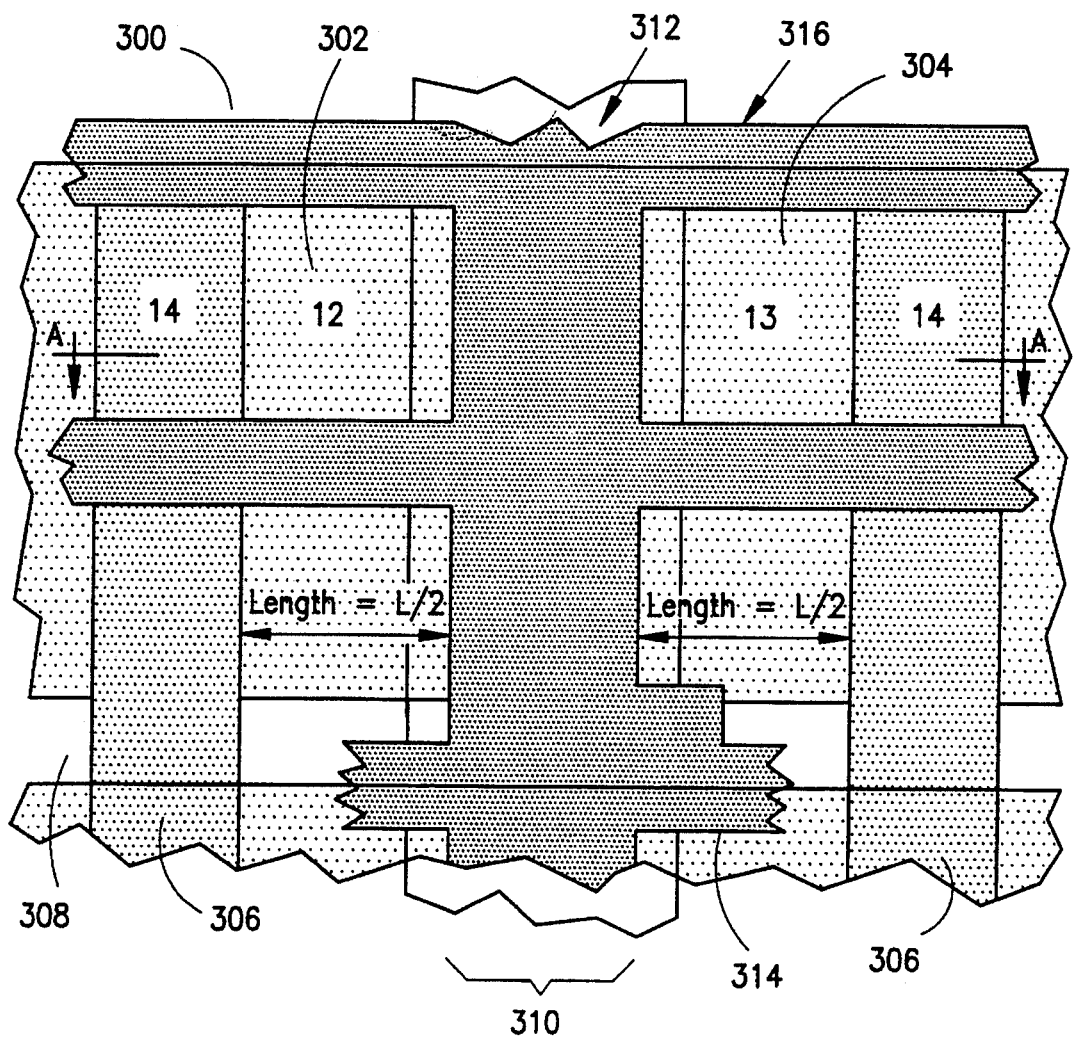
FIG. 3 illustrates an exemplary embodiment of a split interline transfer pixel in accordance with the present invention.

FIG. 3 illustrates an exemplary embodiment of an apparatus for detecting photocharge in accordance with the present invention. The FIG. 3 apparatus is represented as a structure 300 which includes a means for accumulating photocharge in a first photocharge accumulation area of at least one pixel and in a second photocharge accumulation area of said at least one pixel. The charge transfer efficiency associated with photocharge transfer across the photocharge accumulating means is affected by three time constants: (1) thermal diffusion of carriers based on different concentrations of particles in the photocharge accumulation area; (2) self-induced drift due to self-repulsion of negative electrons (self-repulsion can be significant for large charge packets, thereby decreasing the time constant); and (3) fringe electric fields based on different gate potentials (these fields can be significant over short distances, thereby reducing the time constant). Of these three time constants, the thermal diffusion constant is the longest, and is proportional to a square of the length L.

Thus, for two photogates of lengths L1 and L2, where L2 is equal to twice the length of L1, the photogate L1 will have a charge transfer efficiency for a transfer time T1, and the photogate of length L2 will have a transfer time of T2. Because L2 is two times greater than L1, T2 will be four times T1 for the same charge transfer efficiency. Accordingly, an exemplary photocharge accumulating means of the present invention is represented as a pixel having a first charge accumulation area 302 and a second charge accumulation area 304, each having a length L/2 which corresponds to one-half of the overall length L of a photocharge accumulation area for the pixel illustrated (e.g., one-half of the length L of a conventional photocharge accumulation area illustrated with respect to the conventional pixel in FIG. 1).

Figure 1:
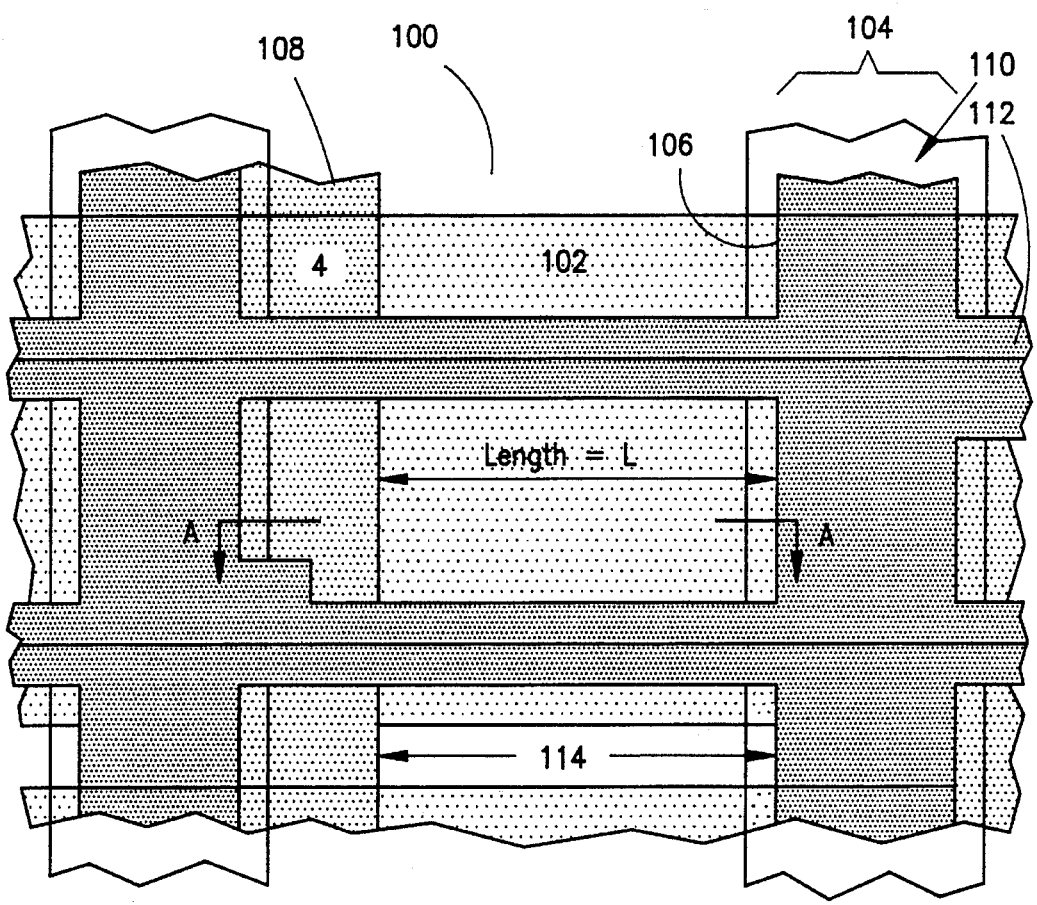
FIG. 1 illustrates a conventional interline transfer pixel.
Figure 2:
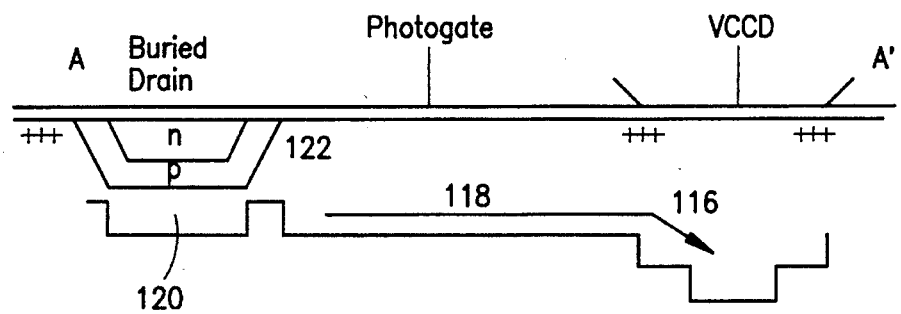
FIG. 2 illustrates a cross-section of the FIG. 1 interline transfer pixel during a charge transfer from the pixel.

The FIG. 1 structure further includes means for controlling exposure of the photocharge accumulating means, such as a self-aligned buried drain 306. The buried drain 306 runs between outer edges of the photocharge accumulation areas to separate the photoelement of one pixel from the photoelement of another adjacent pixel in the imaging array. By controlling exposure of the photocharge accumulating means, anti-blooming can be provided.

The FIG. 3 structure further includes means for inhibiting photocharge transfer between adjacent pixels. The photocharge inhibiting means can include, in an exemplary embodiment, channel stop regions 308 for delineating adjacent photoelements along a vertical direction (i.e., for delineating pixels located adjacent one another along a direction orthogonal to a row of pixels).

A combining means is operatively connected with the first and second photocharge accumulation areas of FIG. 1 for combining the photocharge accumulated in each of the first and second charge accumulation areas into a single photocharge packet. The combining means can include a vertical shift register 310 covered by a means for supplying a clock signal, such as a single phase clock signal for the vertical shift register. In the exemplary FIG. 3 structure, a conductive clock bus 312 is connected to a single polysilicon gate by a contact 314, which in turn connects gates in adjacent pixels via a lateral strip of polysilicon 316.

Figure 4:
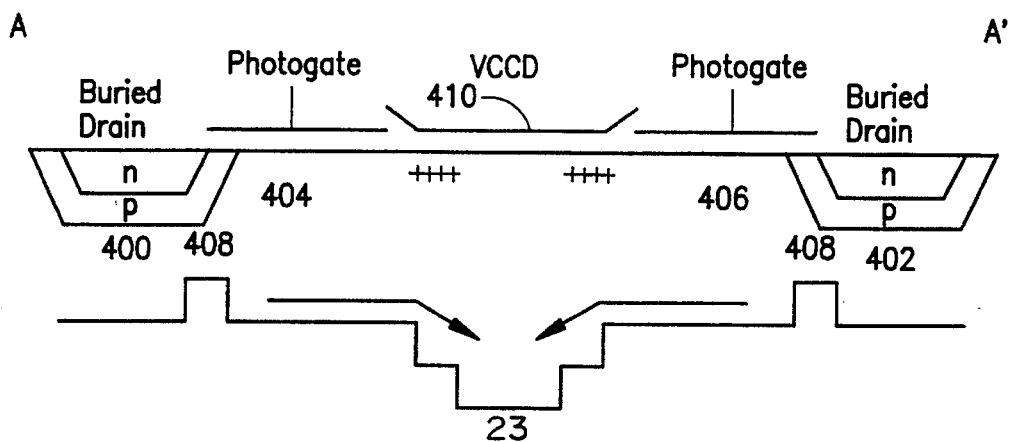
FIG. 4 illustrates a cross-section of the FIG. 3 interline transfer pixel during a charge transfer from the pixel.

FIG. 4 illustrates an exemplary cross-section of the pixel structure illustrated in FIG. 3, with potentials and implants beneath various regions of the FIG. 3 structure being illustrated for the condition where photocharge is transferred from the first and second photocharge accumulation areas to the vertical shift register 310 (i.e., a cross-section along lines A–A' of FIG. 3). In FIG. 4, a first buried drain 400 and a second buried drain 402 are present on both sides of the photocharge accumulation means represented by first and second photocharge accumulation areas 404 and 406. The photocharge accumulation areas 404 and 406 can be formed using a photosensitive elements, such as photogates. The buried drains 400 and 402 separate the outer edges of the charge accumulation means from adjacent pixels in the imaging array.

Barrier regions of FIG. 3 are illustrated in FIG. 4 as barrier regions 408 for preventing flow of photocharge from the photocharge accumulation areas into the buried drain during transfer of the photocharge from the first and second photocharge accumulation areas (i.e., photogates 404 and 406) to the vertical shift register 410. Beneath the photogates 404 and 406 of FIG. 4, fringe fields will not affect photocharge located at regions near the center and outer edges of the photogates which are adjacent the barrier regions 408.

In operation, self-repulsion will cause substantially all of the photocharge in the photocharge accumulation areas 404 and 406 of the pixel shown to be transferred into the vertical shift register 410, wherein the photocharge from areas 404 and 406 is combined. Any remaining charge in the photogates is thermal diffusion limited across the length of the first and second photocharge accumulation areas. As described previously, the thermal-diffusion time constant is proportional to the square of the length of each photocharge accumulation area. Accordingly, by using two photogates 404 and 406 each having lengths equal to one-half the length of the photocharge accumulation means for a given pixel, the thermal time constant can be reduced by a factor of four. The transfer speed during the thermal diffusion period can therefore be reduced to one quarter of the transfer speed of a conventional pixel as illustrated in FIG. 1.

Using conventional electronic exposure control and shuttering to limit anti-blooming, some or all of the photocharge accumulated beneath the photogates 404 and 406 can be transferred into the buried drains 400 and 402, respectively. This transfer can be in a manner similar to that used to transfer photocharge from each of the photogates 404 and 406 into the vertical shift register 410, with the transfer being implemented in the opposite direction. In this situation, photocharge will be thermal-diffusion limited across the length of each photogate as it is transferred to each buried drain. Again, by reducing the length of each photocharge accumulation area to one-half that of a conventional pixel, the transfer time in providing exposure control and shuttering can be reduced to one quarter of the transfer time associated with the FIG. 1 pixel. Therefore, substantially faster exposure control and shutter speeds can be achieved without degrading accuracy of signal detection.

Although the length of the exemplary photogates illustrated in FIG. 3–4 is reduced to one-half of that associated with the conventional photogate of FIG. 1, those skilled in the art will appreciate that the overall length of the combined charge accumulation means in FIG. 3 can be comparable to that of the FIG. 1 structure. Thus, the overall size of the FIG. 3 pixel structure can be considered comparable to that of the FIG. 1 structure. That is, the fill factor, represented as a ratio of non-opaque pixel area to total pixel area, remains approximately the same, while improved exposure control and shuttering is achieved without degradation of signal detection accuracy. Such a feature can be achieved by avoiding any requirement for an extra metal bus in the FIG. 3 structure. Because the fill factor associated with a pixel will influence sensitivity of the pixel, those skilled in the art will appreciate that the FIG. 3 pixel structure, while providing relatively high exposure control and shuttering speeds, can accurately detect a signal of interest (e.g., laser pulse) even in the presence of low signal-to-noise ratios.

In the exemplary embodiment of FIGS. 3 and 4, an interline transfer pixel structure can be used as a photocharge accumulation means which includes n+ photodiodes or n– pinned photodiodes in place of the photogates described. In exemplary embodiments where the photogates are replaced with photodiodes, the buried drain structure can be replaced with other forms of anti-blooming/exposure control structures, such as diodes with polysilicon metal-oxide semiconductor gates.

The exemplary embodiment of FIGS. 3 and 4 was described with respect to a symmetrical arrangement of the first and second charge accumulation areas. However, those skilled in the art will appreciate that by design, or by fabrication practicalities (e.g., misalignments in photomasking), an asymmetrical arrangement of the photocharge accumulation means can occur. For example, the photogate 302 of FIG. 3 can be of greater or lesser length than that of the photogate 304. However, if the charge accumulation means of all pixels in the charge-coupled device are formed with a similar asymmetrical arrangement, pixel response non-uniformity will not degrade performance.

Figure 5:
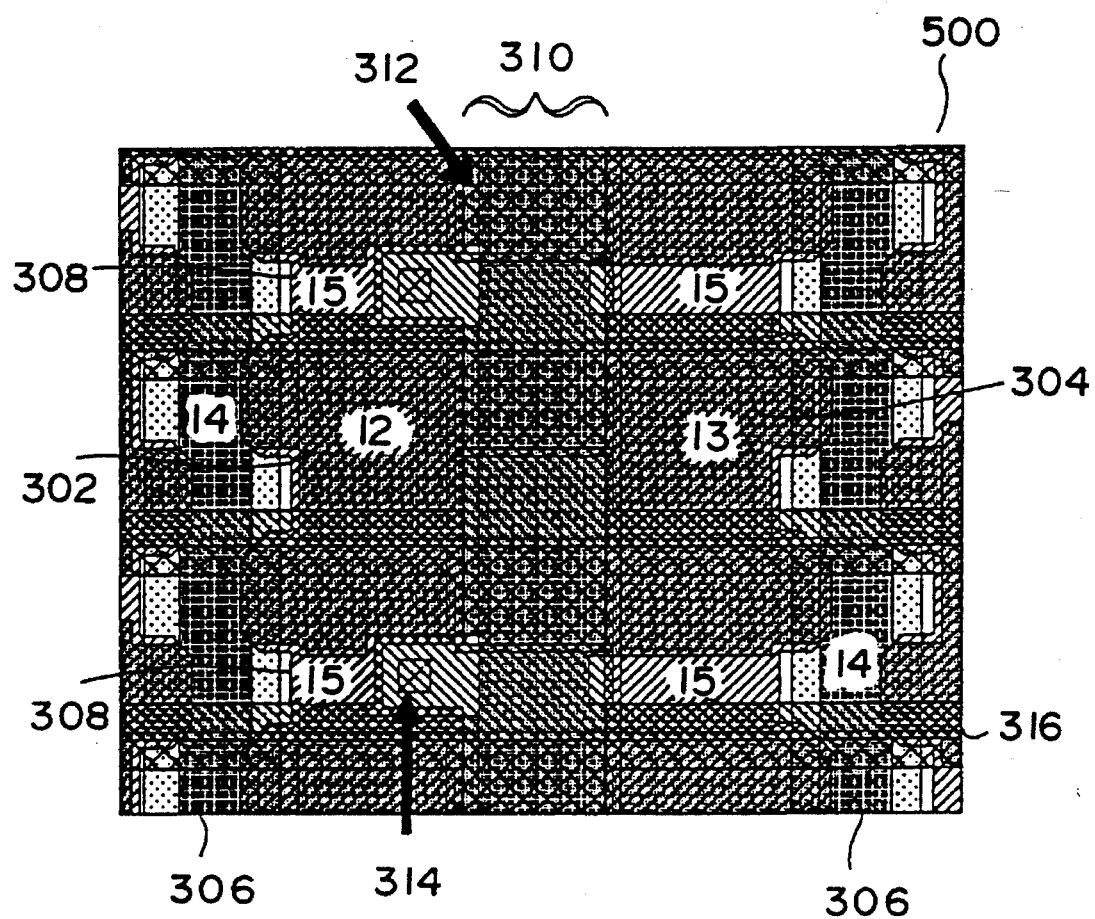
FIG. 5 illustrates an exemplary layout of the FIG. 4 interline transfer pixel.

FIG. 5 illustrates an exemplary layout of a pixel which includes the pixel structure of FIGS. 3 and 4. In the exemplary FIG. 5 embodiment, an interline transfer pixel structure represented as an array of 256 pixels is provided wherein each pixel includes at least one photoelement. In the exemplary FIG. 5 embodiment, each pixel can include 125 photoelements arranged along 125 rows fabricated using frame interline transfer. The photocharge from each column can be binned into a single storage element, and the device operated in a linear array mode.

Using conventional fabrication techniques, the charge-coupled device imaging array 500 can be fabricated using a two-metal, three-polysilicon, n-type metal-oxide semiconductor buried channel charge-coupled device process. The gates of the vertical shift register 310 can be fabricated on the second and third polysilicon layers, with the photogates 302 and 304 being fabricated on the first polysilicon layer for exposure to incident light. The clock buses 312, 316 used to drive the vertical shift register can also be fabricated on the first metal layer.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. Apparatus for detecting photocharge comprising:

means for accumulating photocharge in a first photocharge accumulation area of at least one pixel and in a second photocharge accumulation area of said at least one pixel; and means operatively connected with said first and second photocharge accumulation areas for combining the photocharge accumulated in each of said first and second charge accumulation areas into a single photocharge packet.

2. Apparatus according to claim 1, further comprising:

means for controlling exposure of the photocharge accumulating means.

3. Apparatus according to claim 2, wherein said exposure controlling means further comprises:

a buried drain located adjacent each of said first and second photocharge accumulation areas.

4. Apparatus according to claim 2, wherein said exposure controlling means further comprises:

a diode and a polysilicon metal-oxide semiconductor gate located adjacent each of said first and second photocharge accumulation areas.

5. Apparatus according to claim 1, further comprising:

an array of pixels which includes said at least one pixel; and means for inhibiting photocharge transfer from the photocharge accumulating means of said at least one pixel to a photocharge accumulating means of a second pixel located adjacent said at least one pixel in said array.

6. Apparatus according to claim 5, wherein said photocharge transfer inhibiting means further comprises:

barrier regions located adjacent each of said first and second photocharge accumulation areas.

7. Apparatus according to claim 6, further comprising:

channel stop regions for separating said at least one pixel from another adjacent pixel located orthogonal to said second pixel.

8. Apparatus according to claim 1, wherein said photocharge accumulating means further comprises:

a first photoelement forming said first photocharge accumulation area and a second photoelement forming said second photocharge accumulation area.

9. Apparatus according to claim 1, wherein said photocharge accumulating means further comprises:

a first photogate forming said first photocharge accumulation area and a second photogate forming said second photocharge accumulation area.

10. Apparatus according to claim 1, wherein said combining means further comprises:

a shift register located between said first and second photocharge accumulation areas for combining photocharge from each of said first and second photocharge accumulation areas.

11. Apparatus according to claim 10, further comprising:

means for supplying a clock signal to the shift register to shift combined photocharge from each of said first and second photocharge accumulation areas to an output of said apparatus via said shift register.

12. Apparatus according to claim 11, wherein said clock signal supplying means is placed over said combining means to inhibit incident light from accessing said combining means.

13. Apparatus according to claim 11, wherein said clock signal supplying means is a metal bus covering said shift register.

14. Method for detecting photocharge comprising the steps of:

accumulating a frame of photocharge in a first photocharge accumulation area of at least one pixel and in a second photocharge accumulation area of said at least one pixel during a first sample time; and combining the photocharge accumulated in each of the first and second photocharge accumulation areas into a photocharge packet.

15. Method according to claim 14, further including the step of:

controlling exposure of the photocharge accumulation by supplying a clock signal to each of the first and second photocharge accumulation areas.

16. Method according to claim 15, further including the step of:

inhibiting the transfer of photocharge accumulated in the first and second charge accumulation areas from being transferred to a second pixel.

17. Method according to claim 14, wherein said step of combining further includes the step of:

transferring photocharge across each of said first and second photocharge accumulation areas into a shift register located between said first and second photocharge accumulation areas.

* * * * *